United States Patent [19]
Nakashiba

[11] Patent Number: 5,385,849
[45] Date of Patent: Jan. 31, 1995

[54] PROCESS OF FABRICATING SOLID-STATE IMAGE PICK-UP DEVICE FREE FROM CRYSTAL DEFECTS IN ACTIVE REGION

[75] Inventor: Yasutaka Nakashiba, Tokyo, Japan

[73] Assignee: NEC Corporation, Tokyo, Japan

[21] Appl. No.: 242,954

[22] Filed: May 16, 1994

[30] Foreign Application Priority Data

May 17, 1993 [JP] Japan .................................. 5-113553

[51] Int. Cl.6 .................................................... H01L 31/18
[52] U.S. Cl. ......................................... 437/3; 437/53;
437/984; 156/653
[58] Field of Search ..................... 437/2, 3, 4, 53, 984;
156/653; 257/222, 223

[56] References Cited

U.S. PATENT DOCUMENTS

| | | | |
|---|---|---|---|
| 4,910,568 | 3/1990 | Takei et al. | 257/222 |
| 5,041,392 | 8/1991 | Kuroda et al. | 437/3 |
| 5,288,656 | 2/1994 | Kusaka et al. | 437/53 |

FOREIGN PATENT DOCUMENTS

| | | | |
|---|---|---|---|
| 60-106142 | 6/1985 | Japan . | |
| 2-304974 | 12/1990 | Japan . | |
| 3-181171 | 8/1991 | Japan | 437/3 |

*Primary Examiner*—T. N. Quach
*Attorney, Agent, or Firm*—Burns, Doane, Swecker & Mathis

[57] ABSTRACT

A process of fabricating a solid-state image pick-up device forms a composite mask structure consisting of an upper photo-resist mask and a lower polysilicon layer patterned through the upper photo-resist mask and having an outer periphery offset to the outer periphery of the upper photo-resist mask, and formation of an n-type photo-electric converting region and a channel doping are sequentially carried out by using the upper photo-resist mask and the lower polysilicon layer in a self-aligned manner.

8 Claims, 8 Drawing Sheets

PROCESS OF FABRICATING SOLID-STATE IMAGE PICK-UP DEVICE FREE FROM CRYSTAL DEFECTS IN ACTIVE REGION

FIELD OF THE INVENTION

This invention relates to a solid-state image pick-up device and, more particularly, to a process of solid-state image pick-up device.

DESCRIPTION OF THE RELATED ART

A typical example of the process of fabricating a solid-state image pick-up device starts with preparation of an n-type silicon substrate 1, and a p-type well 2 is formed in the surface portion of the n-type silicon substrate 1 as shown in FIG. 1A.

Subsequently, a silicon oxide film 3 is grown to 40 nanometers on the p-type well 2, and, thereafter, a silicon nitride film 4 is deposited to thickness of 120 nanometers. A photo-resist mask 5 is provided on the silicon nitride film 4 through lithographic techniques, and partially exposes the silicon nitride film 4 over a photo-electric converting region and a charge transfer region of the p-type well 2. Using the photo-resist mask 5, the silicon nitride film 4 is partially etched away through a plasma-etching, and the resultant structure at this stage is illustrated in FIG. 1B.

The photo-resist mask 5 is stripped off. An appropriate mask (not shown) covering the charge transfer region is patterned through the lithographic techniques, and n-type impurity atoms are ion-implanted into the p-type well 2 in a self-aligned manner with the patterned silicon nitride layer 4. The mask is removed, and the n-type impurity atoms are driven into the p-type well 2 for forming an n-type photo-electric converting region 6. A new mask (not shown) is patterned through the lithographic techniques for the charge transfer region 4, and n-type impurity atoms are introduced into the p-type well 2 in a self-aligned manner with the patterned silicon nitride layer 4. The n-type impurity atoms are thermally diffused into the p-type well 2, and an n-type charge transfer region 7 is formed in the p-type well 2. The mask is stripped off, and the resultant structure is illustrated in FIG. 1C.

The resultant structure is placed in an oxidation atmosphere, and the p-type well 2 is thermally oxidized. Although the p-type well 2 beneath the patterned silicon nitride layer 4 is hardly oxidized, the other silicon oxide film 3 is thermally oxidized to 300 nanometers. As a result, the silicon oxide film 3 has thin portions 3a covered with the patterned silicon nitride layer 4 and thick portions 3b exposed to the oxidation atmosphere.

The patterned silicon nitride layer 4 is etched away through a wet etching, and p-type impurity atoms are ion implanted into an intermediate surface portion between the n-type photo-electric converting region 6 and the n-type charge transfer region 7 for regulating a doping level of a p-type channel region 8.

An appropriate mask 9 is patterned over the p-type channel region 8 through the lithographic techniques, and heavily-doped p-type channel stopper regions 10 are formed beneath the thin portions 3a uncovered with the mask 9 through the ion-implantation technique. The resultant structure of this stage is illustrated in FIG. 1D.

The mask 9 is stripped off, and the silicon oxide film 3 is removed in an appropriate etchant. The surface portion of the p-type well 2 is thermally oxidized, and a thin gate oxide film 11 is thermally grown. Polysilicon is deposited through a low-pressure chemical vapor deposition technique for covering the entire surface with a polysilicon film, and an appropriate mask (not shown) is provided on the polysilicon film. Using the mask, the polysilicon film is patterned by using a plasma-etching so that read-out/charge-transfer electrodes 12 are formed as shown in FIG. 1E.

Using the read-out/charge-transfer electrodes 12 as a mask, p-type impurity atoms are ion implanted into the n-type photo-electric converting region for forming heavily-doped shallow p-type region 13. The n-type photo-electric converting region 6 and the heavily-doped p-type shallow region 13 as a whole constitute a photo-electric converting element. An inter-level insulating film 14 is deposited over the entire surface of the structure, and contact holes (not shown) are formed in the inter-level insulating film 14. A metal layer is deposited over the entire surface, and is patterned into a photo-shield layer 15 as shown in FIG. 1F.

A problem is encountered in the prior art process sequence in that crystal defects are generated in the photo-electric converting element, and the impurity profile is liable to vary.

SUMMARY OF THE INVENTION

It is therefore an important object of the present invention to provide a process of fabricating a solid-state image pick-up device which is free from the problems inherent in the prior art process.

The present inventor contemplates the problems, and noticed that the thick portions 3b were causative of a dislocation loop for the crystal defects and that the crystal defects disturbed the impurity profile.

To accomplish the object, the present invention proposes to provide a mask structure having a lower mask offset to an upper mask.

In accordance with the present invention, there is provided a process of fabricating a solid-state image pick-up device having at least one photo-electric converting element and at least one charge transfer register, comprising the steps of: a) preparing a semiconductor substrate structure of a first conductivity type; b) covering a surface of the semiconductor substrate structure with a protecting layer against a first etchant and a second etchant; c) covering the protection layer with a patternable layer; d) providing a first mask on the patternable layer; e) etching the patternable layer by using the first etchant so as to form a patterned layer under the first mask; f) laterally etching an outer peripheral portion of the patterned layer by using the second etchant so as to inwardly offset an outer periphery of the patterned layer to an outer periphery of the first mask; g) introducing dopant impurities of a second conductivity type opposite to the first conductivity type into the semiconductor substrate structure by using the first mask for forming a first impurity region of the second conductivity type; h) removing the first mask for exposing the patterned layer; i) introducing dopant impurities of the first conductivity type into the semiconductor substrate structure by using the patterned layer as a second mask for forming a channel region contiguous to the first impurity region; j) removing the first patterned layer and the protection layer for exposing the semiconductor substrate structure; and k) completing the at least one photo-electric converting element having a second impurity region of the first conductivity type overlapped with the first impurity region and the at least one charge transfer register having a third impurity region of the second conductivity type contiguous to the channel region, a gate insulating film covering at least the channel region and the third impurity region and a gate electrode structure provided on the gate insulating film for transferring a charge packet from the at least one photo-electric converting element through the third impurity region.

BRIEF DESCRIPTION OF THE DRAWINGS

The features and advantages of the process of fabricating a solid-state image pick-up device according to the present invention will be more clearly understood from the following description taken in conjunction with the accompanying drawings in which.

DESCRIPTION OF THE PREFERRED EMBODIMENTS

First Embodiment

Figure 1A:
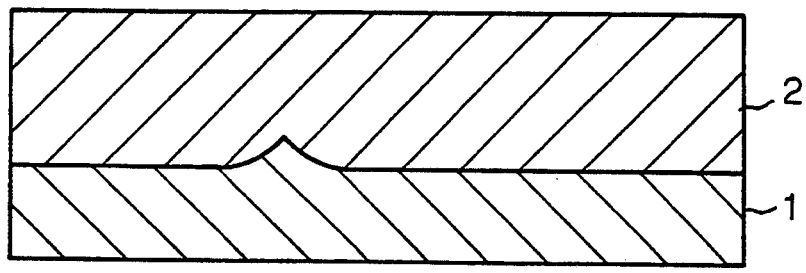
FIG. 1A to 1F are cross sectional views showing the prior art process sequence.
Figure 1B:
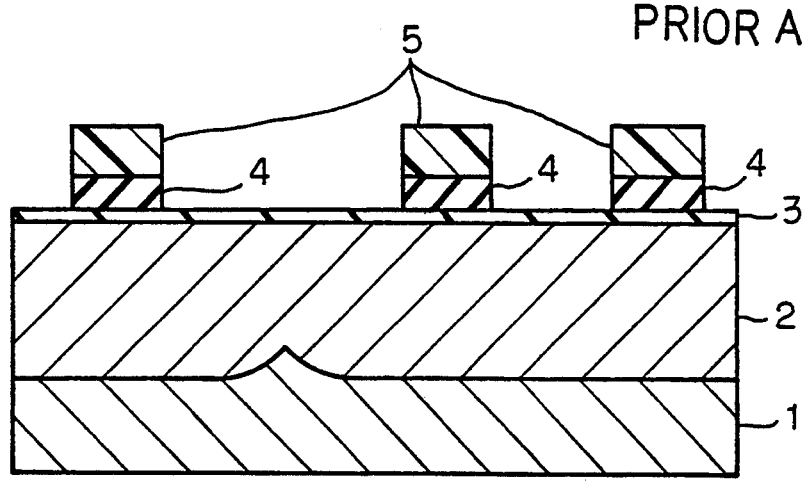
Figure 1C:
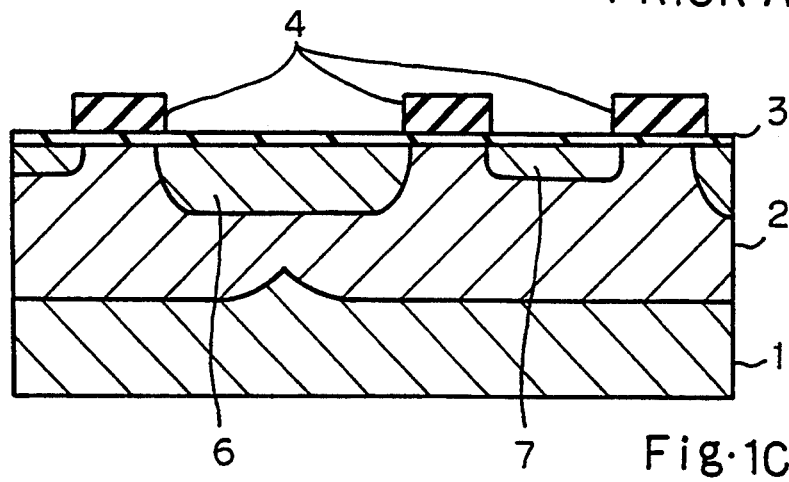
Figure 1D:
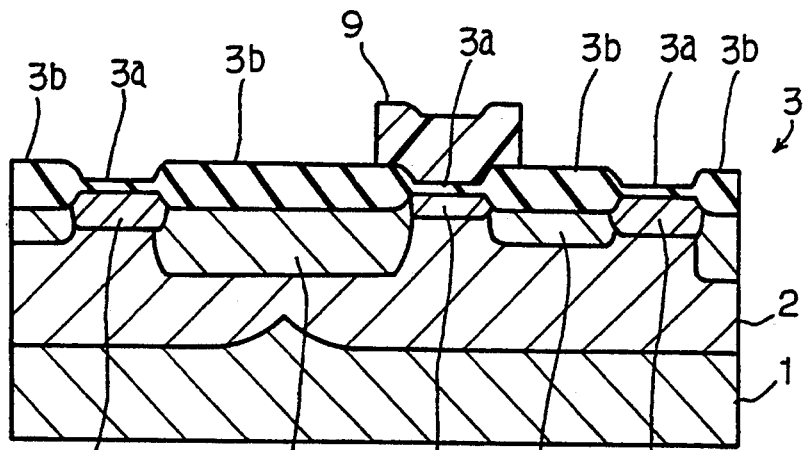
Figure 1E:
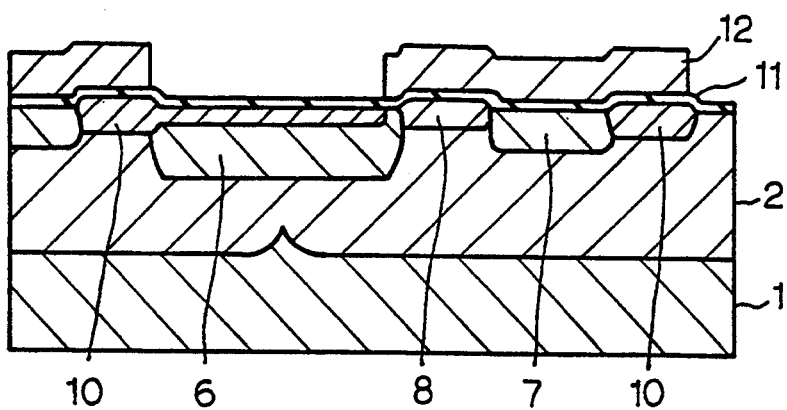
Figure 1F:
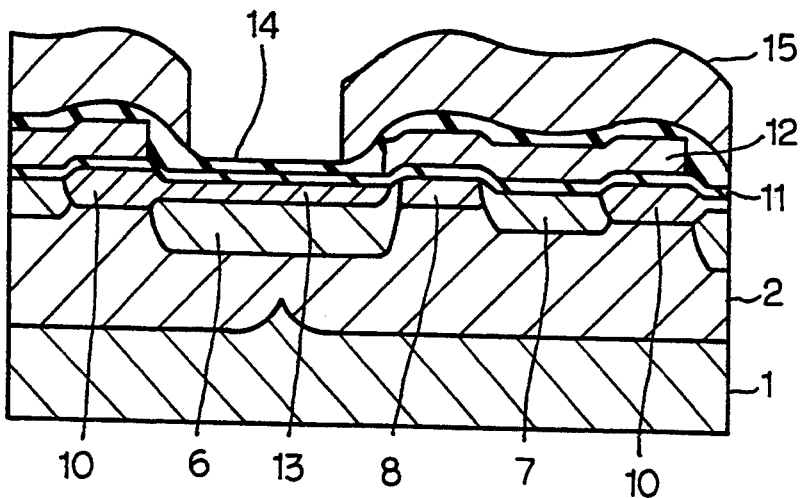

FIGS. 2A to 2G illustrate essential stages of a process sequence for fabricating a solid-state image pick-up device embodying the present invention. Although a matrix of photo-electric converting elements are incorporated in the solid-state image pick-up device, description is focused on a photo-electric converting element only. However, regions and layers of other photo-electric converting elements are labeled with the same references as those of the corresponding regions and layers of the photo-electric converting element in the drawings.

Figure 2A:
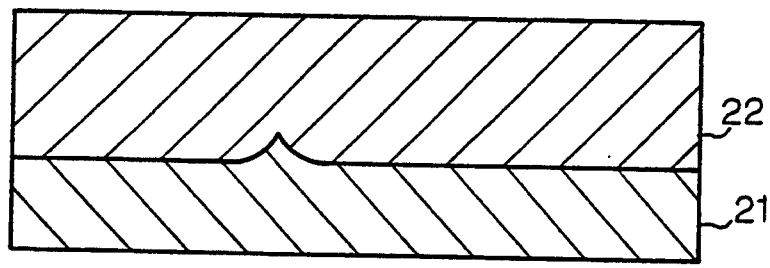
FIG. 2A to 2G are cross sectional views showing a process sequence of fabricating a solid-state image pick-up device according to the present invention.

The process sequence starts with preparation of an n-type silicon substrate 21, and p-type impurity atoms form a p-type well 22 in the n-type silicon substrate 21 as shown in FIG. 2A. The n-type silicon substrate 21 and the p-type well 22 as a whole constitute a semiconductor substrate structure.

Figure 2B:
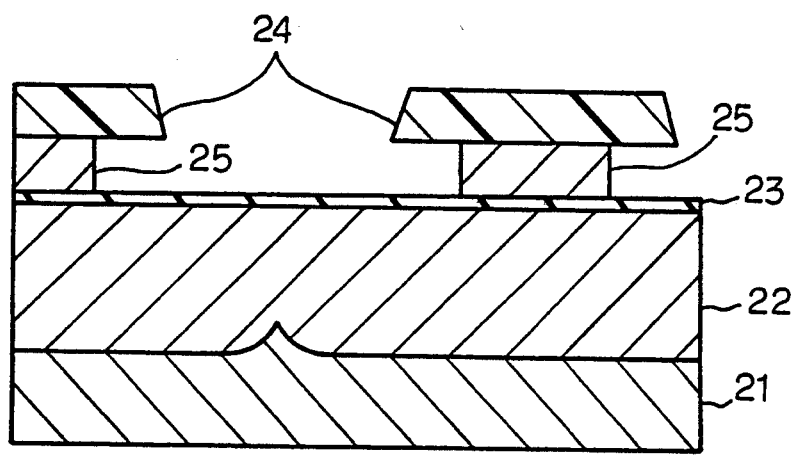

A silicon oxide film 23 is grown to 30 nanometers in thickness in the surface of the structure, and a polysilicon film is deposited to 200 nanometers in thickness over the entire surface of the silicon oxide film 23. A photo-resist mask 24 is provided on the polysilicon film, and exposes the silicon oxide film 23 over a photo-electric converting region. Using the photo-resist mask 24, the polysilicon film is partially etched away so that a patterned polysilicon film 25 is left on the silicon oxide film 25. A wet etching or an isotropic plasma-etching is applied to the patterned polysilicon film 25, and, for this reason, the outer periphery of the patterned polysilicon film 25 recedes from the outer periphery of the photo-resist mask 24 as shown in FIG. 2B. In this instance, the silicon oxide film 23 and the polysilicon film respectively serve as a protection layer against a first etchant and a second etchant and a first patternable layer to be etched by the first etchant and the second etchant, and the photo-resist mask 24 serves as a first mask.

Using the photo-resist mask 24, n-type impurity atoms are ion implanted into the p-type well 22 so as to form an n-type photo-electric converting region 26. The photo-resist mask 24 is stripped off, and the patterned polysilicon film 25 is exposed. After the ion-implantation, the implanted impurity atoms may be thermally diffused for forming the n-type photo-electric converting region 26.

Figure 2C:
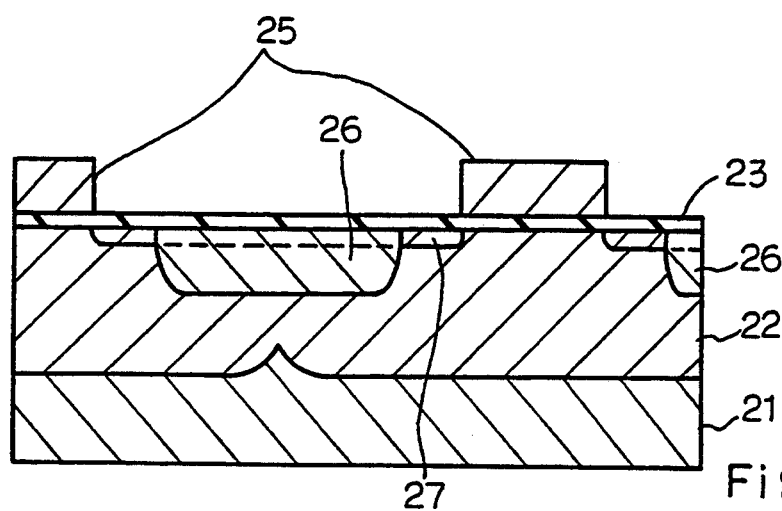

Using the patterned polysilicon film 25 as a mask, p-type impurity atoms are ion implanted into the exposed region of the p-type well 22 and the n-type photo-electric converting region 26, and the p-type impurity atoms regulates a channel doping level in a channel region 27. The resultant structure of this stage is illustrated in FIG. 2C.

Figure 2D:
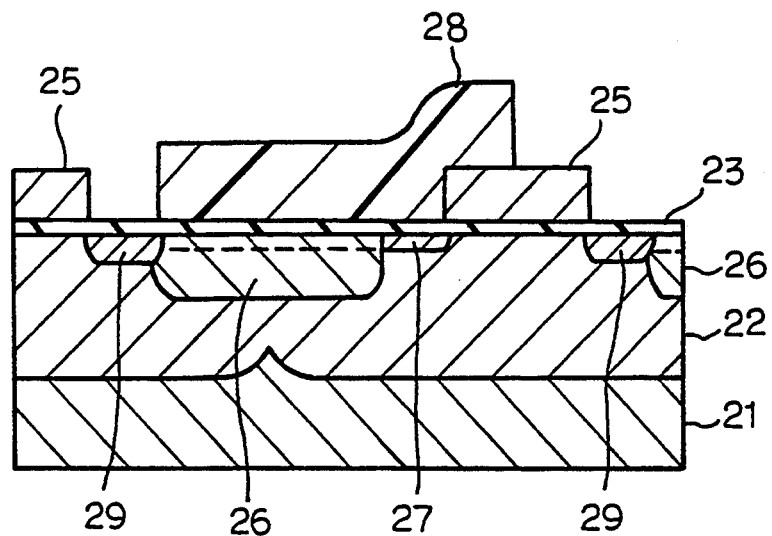

Photo-resist solution is spun onto the entire surface of the structure, and the photo-resist film is patterned into a photo-resist mask 28 covering the channel region 27 and most of the n-type photo-electric converting region 26. Using the photo-resist mask 28, p-type impurity atoms are ion implanted into the surface portion, and heavily-doped p-type channel stopper regions 29 are formed in the exposed region of the p-type well 22 in a self-aligned manner with the patterned polysilicon film 25 as shown in FIG. 2D.

Figure 2E:
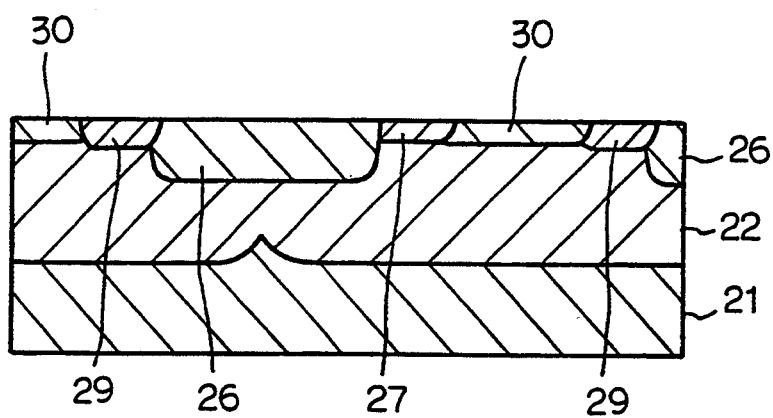
Figure 2F:
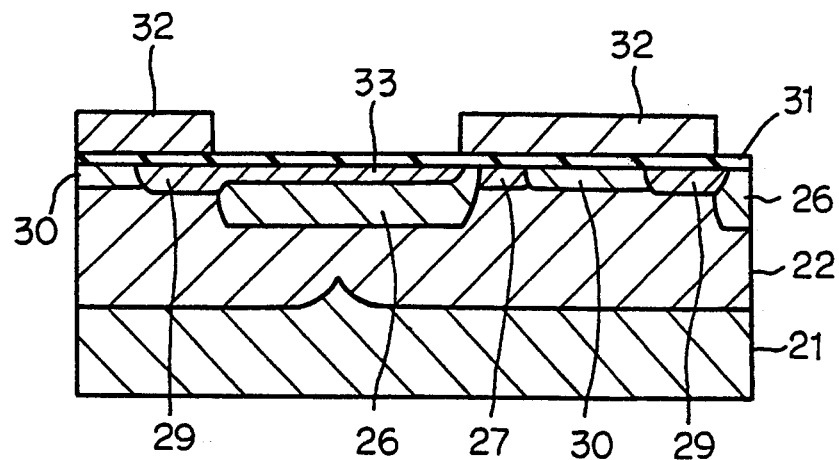

The photo-resist mask 28, the patterned polysilicon film 25 and the silicon oxide film 23 are removed from the structure by using wet etching techniques, and n-type impurity atoms are ion implanted without a mask so as to form an n-type charge transfer region 30 in a self-aligned manner with the channel stopper regions 29 and the channel region 27 as shown in FIG. 2E. Although the ion-implantation with the n-type impurity atoms slightly decreases the dopant level of the p-type channel region 27 and the heavily-doped p-type channel stopper regions 29, the ion implantations with the p-type impurity atoms take the ion-implantation with the n-type impurity atoms into account, and the channel region 27 and the channel stopper regions 29 still remain in the p-type conductivity.

The surface of the structure is thermally oxidized so as to form a gate oxide film 31, and a polysilicon film is deposited on the gate oxide film 31 by using a chemical vapor deposition technique. The polysilicon film is patterned into a gate electrode 31 for reading out and transferring a charge packet. Using the gate electrode 31 as a mask, p-type impurity atoms are ion implanted into the n-type photo-electric converting region 26, and a heavily-doped p-type photo-electric converting region 33 is formed in the surface portion of the n-type photo-electric converting region 26. The n-type photo-electric converting region 26 and the p-type heavily-doped photo-electric converting region 33 form in combination the photo-electric converting element. The heavily-doped p-type photo-electric converting region 33 is merged with the heavily-doped p-type channel stopper region 29, and the resultant structure of this stage is illustrated n FIG. 2F.

Figure 2G:
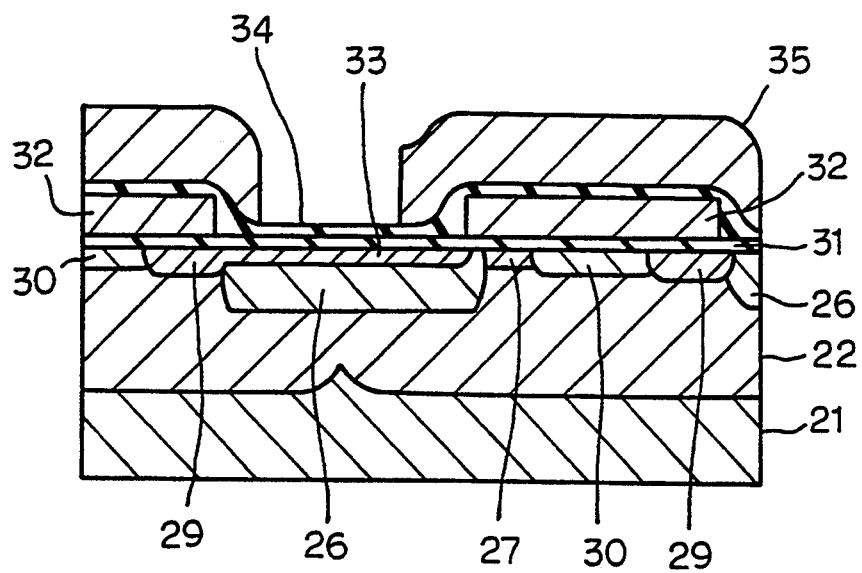

A transparent inter-level insulating film 34 is deposited over the entire surface of the structure, and contact holes (not shown) are formed in the transparent inter-level insulating film 34. A metal film is deposited on the transparent inter-level insulating film 34, and is patterned into a photo-shield plate 35 and wirings (not shown). The resultant structure is illustrated in FIG. 2G.

As will be understood from the foregoing description, the process sequence according to the present invention laterally etches the patterned polysilicon film 25 for offsetting to the photo-resist mask 24, and the photo-resist mask 24 and the patterned polysilicon film 25 are respectively used for forming the n-type photo-electric converting region 26 and the channel region 27. For this reason, a selective oxidation with a silicon nitride film is not required, and a dislocation loop is not produced. This means that the photo-electric converting element is free from crystal defects due to the dislocation loop and that the impurity atoms are never segregated for changing the impurity profile.

Second Embodiment

FIGS. 3A to 3G illustrate another process sequence embodying the present invention. Description is hereinbelow focused on a single photo-electric converting element as similar to the first embodiment.

Figure 3A:
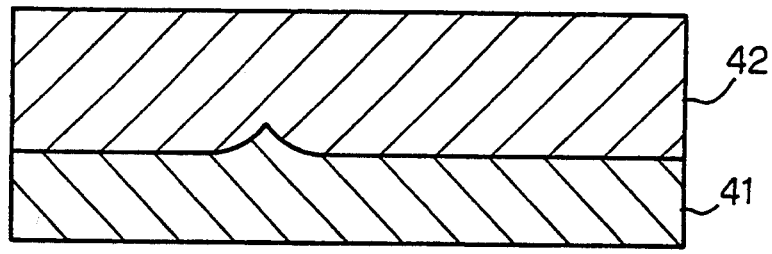
FIGS. 3A to 3G are cross sectional views showing another process sequence of fabricating a solid-state image pick-up device according to the present invention.

The process sequence starts with preparation of an n-type silicon substrate 41, and a p-type well 42 is formed in the surface portion of the n-type silicon substrate 41 as shown in FIG. 3A. The silicon substrate 41 and the p-type well 42 as a whole constitute a semiconductor substrate structure.

Figure 3B:
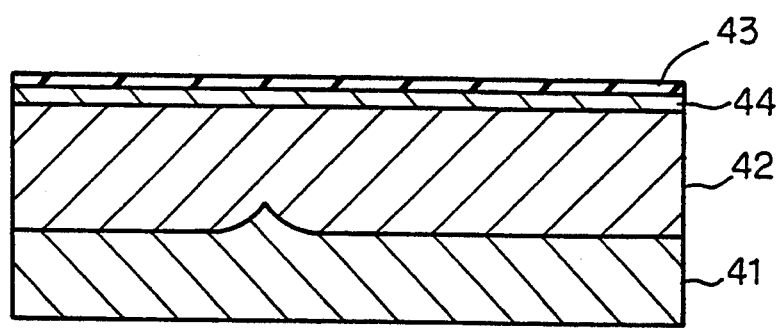

The major surface of the p-type well 42 is thermally oxidized, and the silicon oxide film 43 is grown to 30 nanometers in thickness. N-type impurity atoms are ion implanted into the p-type well 42 without a mask, and an n-type impurity region 44 is formed beneath the silicon oxide film 43. The resultant structure of this stage is illustrated in FIG. 3B.

Figure 3C:
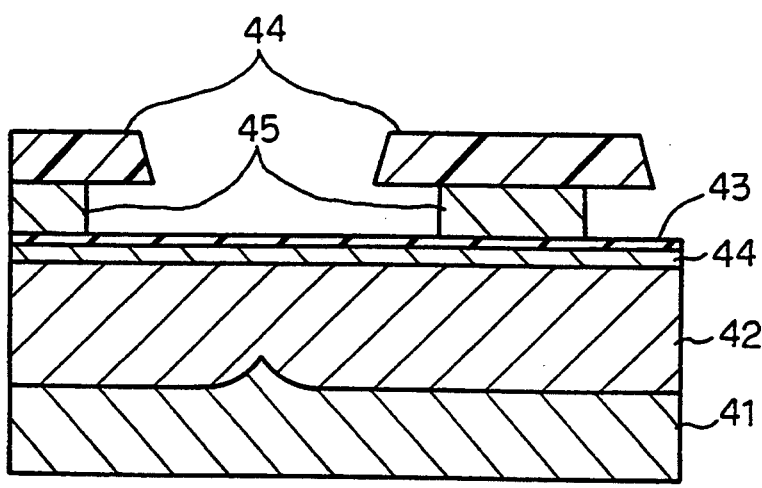

Polysilicon is deposited to 200 nanometers thick over the entire surface of the structure, and a photo-resist mask 44 is patterned for exposing a photo-electric converting region. Using the photo-resist mask 44, the polysilicon film is partially etched away, and the photo-electric converting region is uncovered with the patterned polysilicon film 45. The patterned polysilicon film 45 is laterally etched through a wet etching technique or an isotropic plasma etching technique, and the outer periphery of the patterned polysilicon film 45 is offset to the outer periphery of the photo-resist mask 44. The resultant structure of this stage is illustrated in FIG. 3C.

Using the photo-resist mask 44, n-type impurity atoms are ion implanted into the p-type well 42, and an n-type photo-electric converting region 46 is formed in the p-type well. In yet another process, the n-type impurity atoms may be thermally diffused after the ion-implantation.

Figure 3D:
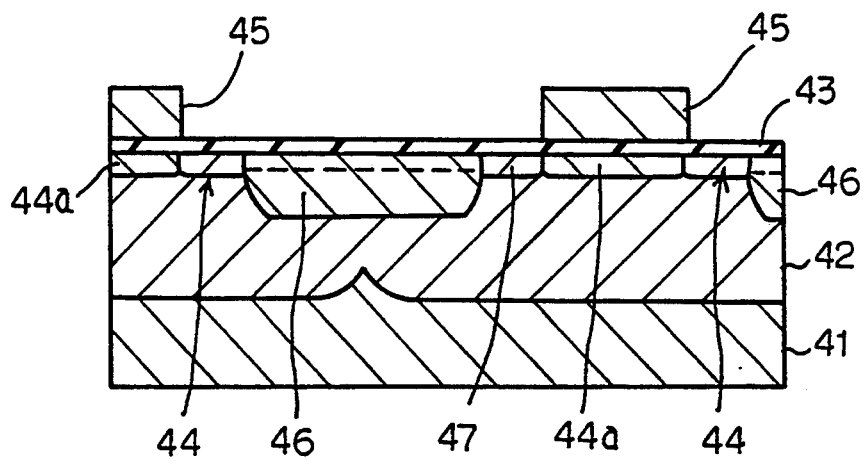

The photo-resist mask 44 is stripped off, and the patterned polysilicon film 45 is exposed. Using the patterned polysilicon film 45 as a mask, p-type impurity atoms are ion implanted, and the dopant level of a channel region 47 is regulated to a predetermined value. An n-type charge transfer region 44a is formed in a part of the n-type impurity region 44 beneath the patterned polysilicon film 45 as shown in FIG. 3D.

Figure 3E:
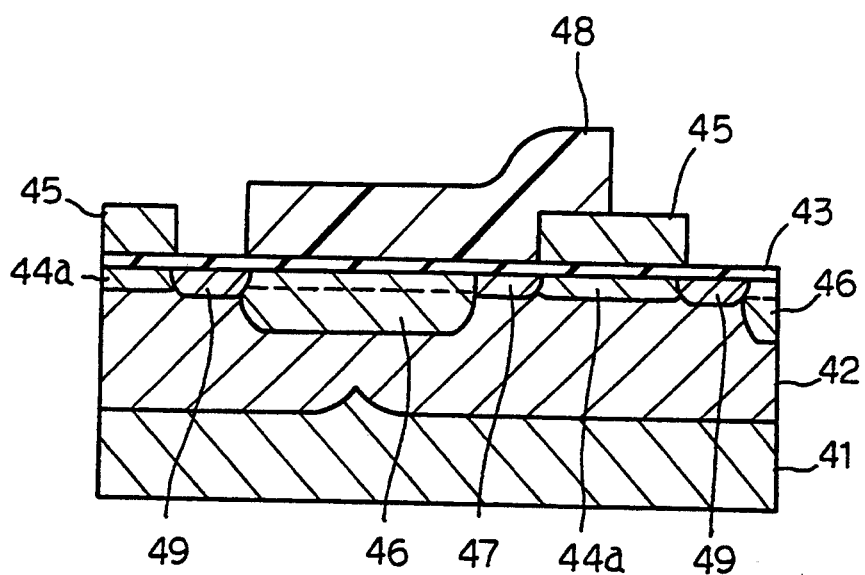

An appropriate photo-mask 48 is provided on the silicon oxide film 43 and the patterned polysilicon-film 45, and covers at least the channel region 47 and most of the n-type photo-electric covering region 46. P-type impurity atoms are ion implanted into the surface portion of the p-type well 42, and heavily-doped p-type channel stopper regions 49 are formed on the left side of the n-type photo-electric converting region 46 and on the right side of the n-type charge transfer region 44a. The resultant structure is illustrated in FIG. 3E.

The photo-resist mask 48, the patterned polysilicon film 45 and the photo-resist mask 48 are removed by using wet etching techniques, and the exposed surface is thermally oxidized for growing a gate insulating film 50.

Polysilicon is deposited over the gate insulating film 50 through a chemical vapor deposition technique, and the polysilicon film is patterned through lithographic techniques into a gate electrode 51 for transferring a charge packet into the n-type charge transfer region 44a. The n-type charge transfer region 44a, the gate insulating film 43 and the gate electrode 51 form in combination a charge transfer register.

Figure 3F:
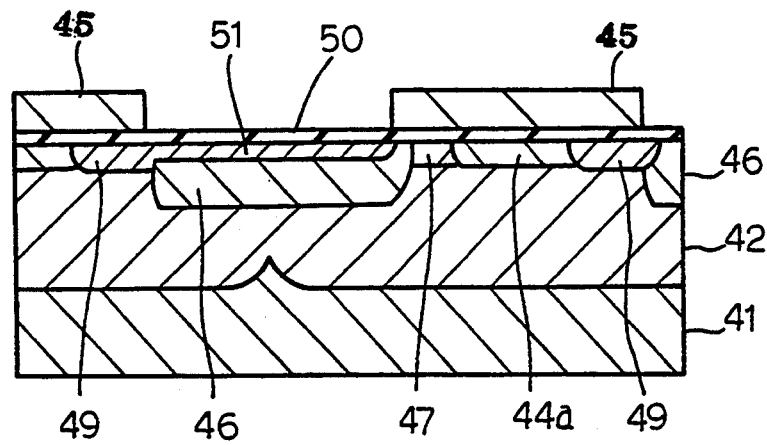
Figure 3G:
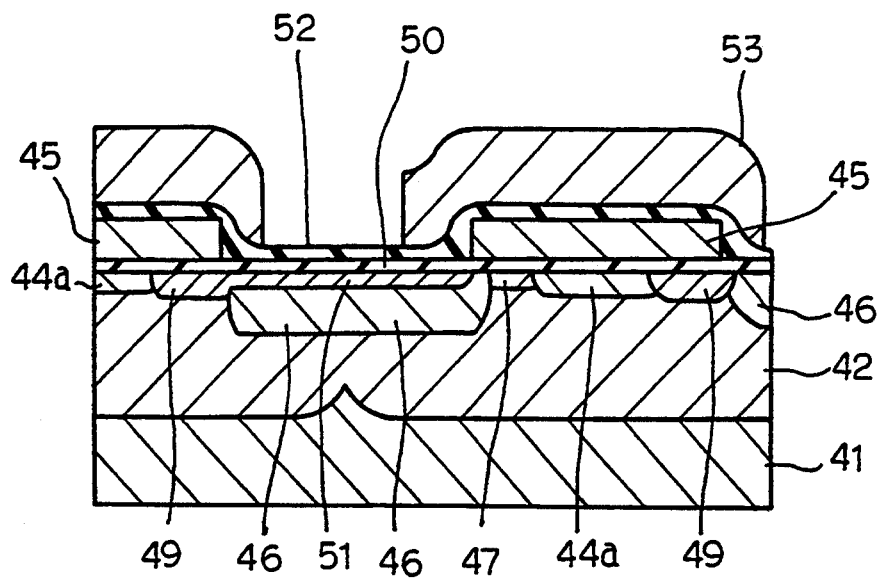

Using the gate electrode 51 as a mask, p-type impurity atoms are ion implanted into the exposed area, and a heavily-doped p-type shallow photo-electric converting region 51 is formed. The n-type photo-electric converting region 46 and the heavily-doped p-type shallow photo-electric converting region 51 as a whole constitute the photo-electric converting element. The resultant structure of this stage is illustrated in FIG. 3F.

An inter-level insulating film 52 is deposited over the entire surface of the structure, and contact holes (not shown) are formed in the inter-level insulating film 52. An appropriate metal or an alloy is sputtered on the interlevel insulating film 52, and the metal film is patterned into wirings (not shown) and a photo-shield plate 53.

As will be appreciated from the foregoing description, the composite mask structure consisting of the photo-resist mask 44 and the patterned polysilicon film 45 allows the two stage ion-implantations to form the n-type photo-electric converting region 46 and the p-type channel region 47 in a self-aligned manner, and a partially increased silicon oxide film is not required. For this reason, a dislocation loop does not take place in the photo-electric converting region, and the photo-electric converting element formed therein is free from crystal defects and segregation of impurities.

Although particular embodiments of the present invention have been shown and described, it will be obvious to those skilled in the art that various changes and modifications may be made without departing from the spirit and scope of the present invention. For example, the preferred embodiments are of an area image sensor with a matrix of photo-electric converting elements. However, a line image sensor may be fabricated through the process sequence according to the present invention. Moreover, the charge transfer register may be a surface charge coupled device instead of the bulk charge coupled device, and two-phase or three-phase charge transfer electrodes may be incorporated in the charge transfer register.

What is claimed is:

1. A process of fabricating a solid-state image pick-up device having at least one photo-electric converting element and at least one charge transfer register, comprising the steps of:

a) preparing a semiconductor substrate structure of a first conductivity type;

b) covering a surface of said semiconductor substrate structure with a protecting layer against a first etchant and a second etchant;

c) covering said protection layer with a patternable layer;

d) providing a first mask on said patternable layer;

e) etching said patternable layer by using said first etchant so as to form a patterned layer under said first mask;

f) laterally etching an outer peripheral portion of said patterned layer by using said second etchant so as to inwardly offset an outer periphery of said patterned layer to an outer periphery of said first mask;

g) introducing dopant impurities of a second conductivity type opposite to said first conductivity type into said semiconductor substrate structure by using said first mask for forming a first impurity region of said second conductivity type;

h) removing said first mask for exposing said patterned layer;

i) introducing dopant impurities of said first conductivity type into said semiconductor substrate structure by using said patterned layer as a second mask for forming a channel region contiguous to said first impurity region;

j) removing said first patterned layer and said protection layer for exposing said semiconductor substrate structure; and k) completing said at least one photo-electric converting element having a second impurity region of said first conductivity type overlapped with said first impurity region and said at least one charge transfer register having a third impurity region of said second conductivity type contiguous to said channel region, a gate insulating film covering at least said channel region and said third impurity region and a gate electrode structure provided on said gate insulating film for transferring a charge packet from said at least one photo-electric converting element through said third impurity region.

2. The process as set forth in claim 1, in which said step k) comprises the sub-steps of k-1) introducing dopant impurities of said second conductivity type without a mask for forming said third impurity region in a self-aligned manner with said channel region, said dopant impurities for said third impurity region keeping the conductivity type of said channel region, k-2) forming said gate insulating film covering at least said channel region and said third impurity region, and k-3) forming said gate electrode structure on said gate insulating film.

3. The process as set forth in claim 1, in which further comprising the step of forming channel stopper regions of said first conductivity type for isolating said photo-electric converting element and said third impurity region from another circuit component between said step i) and said step j).

4. The process as set forth in claim 3, in which further comprising the steps of l) covering said at least one photo-electric converting element and said at least one charge transfer register with an inter-level insulating film after said step k), and m) forming a photo-shield plate on said inter-level insulating film for covering said at least one charge transfer register, said photo-shield plate exposing said at least one photo-electric converting element to an optical radiation.

5. The process as set forth in claim 1, in which further comprising the steps of introducing dopant impurity of said second conductivity type for forming a fourth impurity region of said second conductivity type beneath said protecting layer between said step b) and said step c), and forming channel stopper regions of said first conductivity type for isolating said photo-electric converting element from another circuit component between said step i) and said step j), said channel stopper regions forming said third impurity region from said fourth impurity region, said step h) comprising the sub-steps of h-1) forming said gate insulating film covering at least said photo-electric converting element, said third impurity region and said channel stopper regions, and h-2) forming said gate electrode structure on said gate insulating film.

6. The process as set forth in claim 5, in which further comprising the steps of l) covering said at least one photo-electric converting element and said at least one charge transfer register with an inter-level insulating film after said step k), and m) forming a photo-shield plate on said inter-level insulating film for covering said at least one charge transfer register, said photo-shield plate exposing said at least one photo-electric converting element to an optical radiation.

7. A process of fabricating a solid-state image pick-up device having at least one photo-electric converting element and at least one charge transfer register, comprising the steps of:

a) preparing an n-type semiconductor substrate having a p-type well in a surface portion thereof;

b) covering a surface of said p-type well with a silicon oxide layer against a first etchant and a second etchant;

c) covering said silicon oxide layer with a polysilicon layer;

d) providing a photo-resist mask on said polysilicon layer;

e) etching said polysilicon layer by using said first etchant so as to form a patterned polysilicon layer under said photo-resist mask;

f) laterally etching an outer peripheral portion of said patterned polysilicon layer by using said second etchant so as to inwardly offset an outer periphery of said patterned polysilicon layer to an outer periphery of said photo-resist mask;

g) introducing n-type dopant impurities into said p-type well by using said photo-resist mask for forming an n-type photo-electric converting region; h) removing said photo-resist mask for exposing said patterned polysilicon layer;

i) introducing p-type dopant impurities into said p-type well by using said patterned polysilicon layer as a second mask for forming a p-type channel region contiguous to a surface portion of said n-type photo-electric converting region;

j) forming another photo-resist mask covering at least said p-type channel region;

k) introducing p-type dopant impurities for forming a heavily-doped p-type channel stopper region contiguous to said n-type photo-electric converting region;

l) removing said another photo-resist mask, said patterned polysilicon layer and said silicon oxide layer;

m) introducing n-type dopant impurities without a mask for forming an n-type charge transfer region contiguous to said p-type channel region;

n) forming a gate insulating film on at least said p-type channel region and said n-type charge transfer region;

o) forming a gate electrode structure on said gate insulating film for transferring a charge packet through said p-type channel region to said n-type charge transfer region;

p) introducing p-type dopant impurities by using said gate electrode structure as a mask for forming a p-type photo-electric converting region overlapped with said n-type photo-electric converting region, said n-type photo-electric converting region and said p-type photo-electric converting region forming in combination said at least photo-electric converting element for producing said charge packet;

q) forming a transparent inter-level insulating film over the entire surface; and r) forming a photo-shield plate on said transparent inter-level insulating film for covering said p-type channel region and said n-type charge transfer region, said photo-shield plate exposing said photo-electric converting element to an optical radiation.

8. A process of fabricating a solid-state image pick-up device having at least one photo-electric converting element and at least one charge transfer register, comprising the steps of:

a) preparing an n-type semiconductor substrate having a p-type well in a surface portion thereof;

b) covering a surface of said p-type well with a silicon oxide layer against a first etchant and a second etchant;

c) introducing n-type dopant impurities for forming an n-type impurity region beneath said silicon oxide layer;

d) covering said silicon oxide layer with a polysilicon layer;

e) providing a photo-resist mask on said polysilicon layer;

f) etching said polysilicon layer by using said first etchant so as to form a patterned polysilicon layer under said photo-resist mask;

g) laterally etching an outer peripheral portion of said patterned polysilicon layer by using said second etchant so as to inwardly offset an outer periphery of said patterned polysilicon layer to an outer periphery of said photo-resist mask;

h) introducing n-type dopant impurities into said p-type well by using said photo-resist mask for forming an n-type photo-electric converting region;

i) removing said photo-resist mask for exposing said patterned polysilicon layer;

j) introducing p-type dopant impurities into said p-type well by using said patterned polysilicon layer as a second mask for forming a p-type channel region contiguous to a surface portion of said n-type photo-electric converting region;

k) forming another photo-resist mask covering at least said p-type channel region;

l) introducing p-type dopant impurities by using said another photo-resist mask and said patterned polysilicon layer for forming heavily-doped p-type channel stopper regions, said p-type channel region and one of said heavily-doped p-type channel stopper regions causing a part of said n-type impurity region as an n-type charge transfer region;

m) removing said another photo-resist mask, said patterned polysilicon layer and said silicon oxide layer;

n) forming a gate insulating film on at least said p-type channel region and said n-type charge transfer region;

o) forming a gate electrode structure on said gate insulating film for transferring a charge packet through said p-type channel region to said n-type charge transfer region;

p) introducing p-type dopant impurities by using said gate electrode structure as a mask for forming a p-type photo-electric converting region overlapped with said n-type photo-electric converting region, said n-type photo-electric converting region and said p-type photo-electric converting region forming in combination said at least one photo-electric converting element for producing said charge packet;

q) forming a transparent inter-level insulating film over the entire surface; and r) forming a photo-shield plate on said transparent inter-level insulating film for covering said p-type channel region and said n-type charge transfer region, said photo-shield plate exposing said photo-electric converting element to an optical radiation.

* * * * *